(12) United States Patent
Ross

(10) Patent No.: US 6,360,433 B1
(45) Date of Patent: Mar. 26, 2002

(54) UNIVERSAL PACKAGE AND METHOD OF FORMING THE SAME

(76) Inventor: Andrew C. Ross, 12029-3 World Trade Dr., San Diego, CA (US) 92128

( * ) Notice: Subject to any disclaimer, the term of this patent is extended or adjusted under 35 U.S.C. 154(b) by 0 days.

(21) Appl. No.: 09/664,938

(22) Filed: Sep. 19, 2000

Related U.S. Application Data

(62) Division of application No. 09/298,664, filed on Apr. 23, 1999.

(51) Int. Cl.[7] ................................................ H05K 3/34
(52) U.S. Cl. ........................... 29/840; 29/832; 257/685; 257/686
(58) Field of Search .................... 29/840, 832; 257/685, 257/686, 723

(56) References Cited

U.S. PATENT DOCUMENTS

| | | | |
|---|---|---|---|
| 3,746,934 A | 7/1973 | Stein | 317/101 CM |
| 4,956,694 A | 9/1990 | Eide | 357/74 |
| 5,198,888 A | 3/1993 | Sugano et al. | 257/686 |
| 5,397,916 A | * 3/1995 | Normington | |
| 5,514,907 A | 5/1996 | Moshayedi | 257/723 |
| 5,612,570 A | 3/1997 | Eide et al. | 257/686 |
| 5,677,569 A | * 10/1997 | Choi et al. | |
| 5,869,353 A | 2/1999 | Levy et al. | 438/109 |
| RE36,325 E | * 10/1999 | Corbett et al. | |

* cited by examiner

Primary Examiner—Carl J. Arbes
(74) Attorney, Agent, or Firm—Stetina Brunda Garred & Brucker

(57) ABSTRACT

A chip module comprising a chip array which includes an interconnect substrate having opposed, generally planar surfaces and a first interconnect pad array disposed on at least one of the surfaces thereof. Attached to the interconnect substrate is at least one integrated circuit chip of the chip array which is electrically connected to the first interconnect pad array. The chip module further comprises a package which itself comprises a main body defining a cavity sized and configured to receive the chip array and having a generally planar interconnect shelf which extends within the cavity and includes a second interconnect pad array disposed thereon. The package also includes a lid which is attachable to the main body. The chip array is insertable into the cavity such that the first and second interconnect pad arrays are in aligned contact with each other and the attachment of the lid to the main body encloses and seals the chip array within the package.

10 Claims, 6 Drawing Sheets

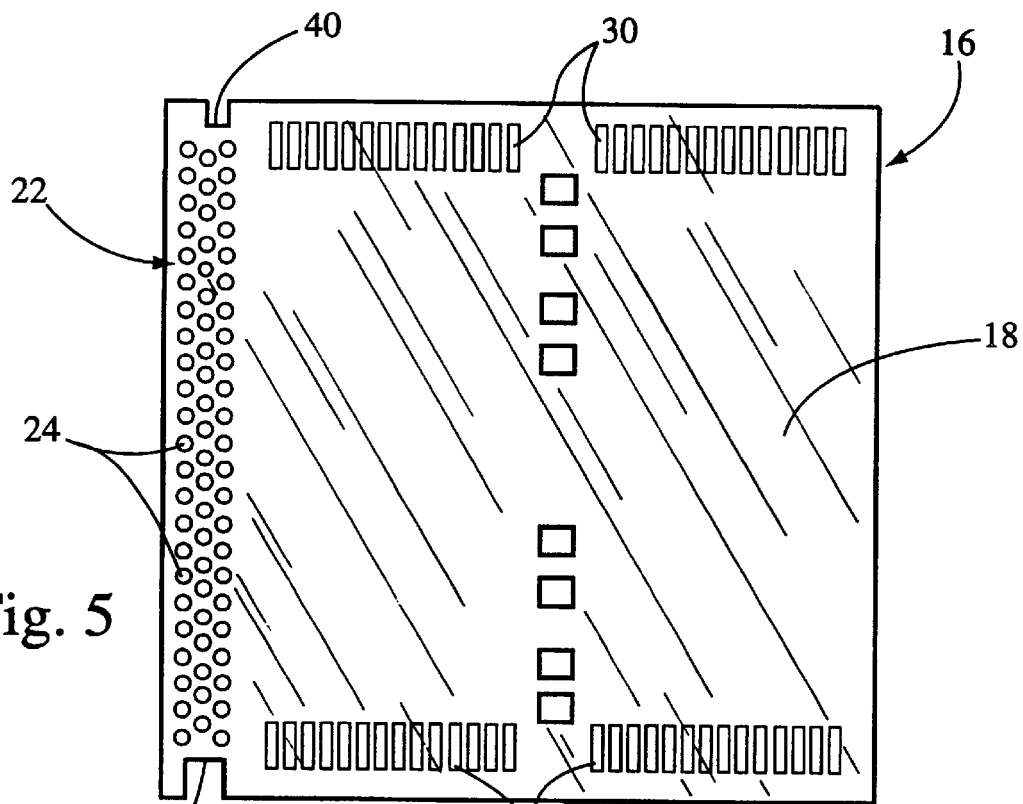
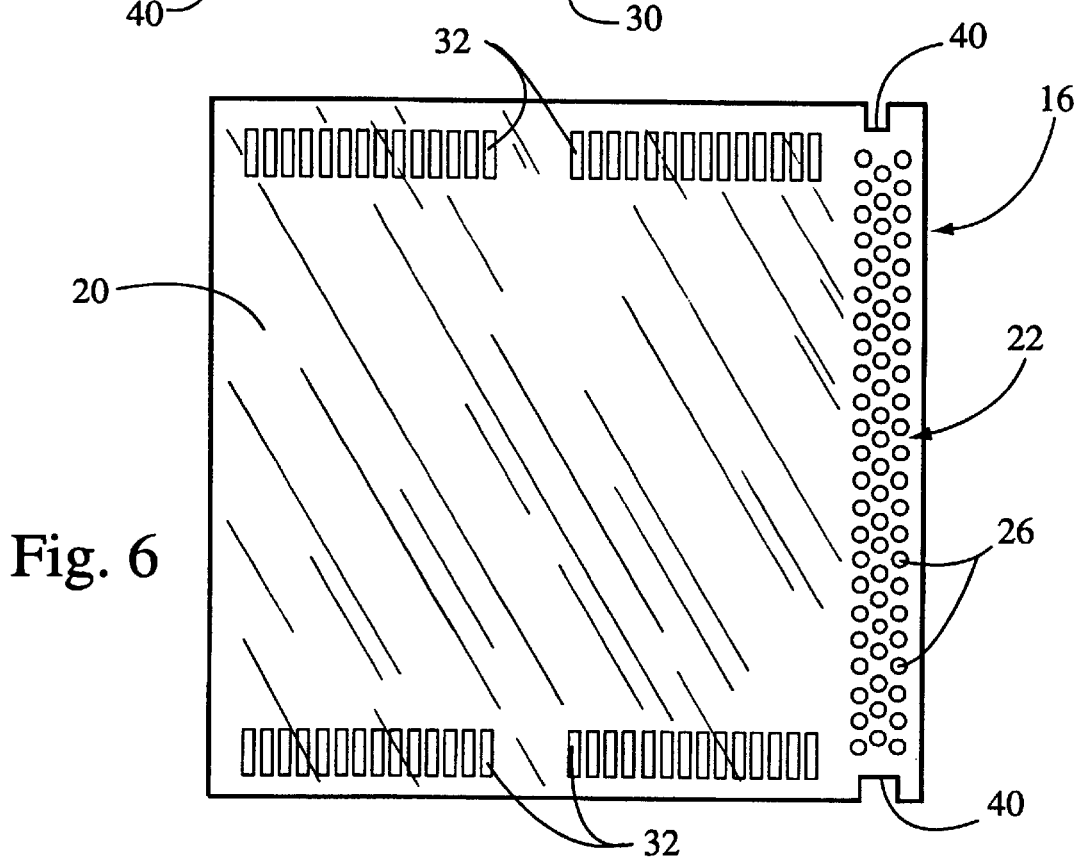

UNIVERSAL PACKAGE AND METHOD OF FORMING THE SAME

This application is a division of Ser. No. 09/298,664, filed Apr. 23, 1999.

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

The present invention relates generally to chip modules, and more particularly to a chip module including a highly configurable chip array which is interconnectable to a universal package capable of hermetically sealing the chip array.

There is currently known in the prior art chip modules comprising a chip array which is mounted into a package for purposes of protecting the chip array from contaminants such as dust and moisture. The package may also be used to convert the chip array to a particular standard pin format. The chip array typically comprises a substrate (e.g., a circuit board) having off-the-shelf, pre-packaged memory or logic devices (e.g., TSOP packaged chips) mounted to one or both of the opposed sides or faces thereof. This chip array is mounted into and sealed within the associated package of the chip module. These prior art chip modules wherein the chip array is sealed within the package to protect the same from contaminants are often used to achieve compliance with stringent military standards such as the JET "X" standard which require extremely low susceptibility to component failure as a result of contamination from external or environmental sources.

Though prior art chip modules are generally suitable for protecting the chip array within the associated package from external contamination, they possess numerous deficiencies which detract from their overall utility. One such deficiency lies in the inability to test the currently known chip modules until the completion of the package assembly process. Due to the complexity of their construction which is attributable in large part to the heat and moisture sensitivity of the internal chip array, such chip modules experience a relatively high failure rate during initial testing. Another deficiency lies in the inability to recover components from these chip modules in the event the same are unsuccessfully tested. For example, if the failure of the chip module during testing is attributable to a soldering problem, the chip module must be scrapped in its entirety due to the currently known configurations and assembly methods related thereto not allowing for the recovery or salvage of either the chip array or the package.

A further deficiency of the prior art chip modules is that the package thereof is device specific, i.e., tailored to accommodate a particular chip array. As such, since the chip array is not confined to one specific configuration but may have any one of a multitude of differing configurations, any particular chip array will typically require a different device specific package. In this respect, the development of a new chip array carries with it the need to develop a new package, and hence new tooling as well as a new assembly protocol. As will be recognized, these constantly changing tooling and assembly requirements significantly increase the product costs of prior art chip modules. Moreover, the configuration of such prior art chip modules, and in particular the chip arrays thereof, does not lend itself to use with newly developed memory or logic devices, thus increasing susceptibility to obsolescence.

The present invention addresses and overcomes these deficiencies of prior art chip modules by providing a low cost, high reliability, high density chip module wherein a highly configurable, custom chip array is interconnectable to a "universal" package. In the present chip module, the chip array includes a novel and unique interconnect substrate having an interconnect array which is specifically adapted to electrically communicate with a corresponding interconnect array provided within a cavity of the package. In view of the complementary nature of these interconnect arrays, the package is universal in the sense that it may be used in conjunction with any chip array including the interconnect substrate. The package in the present chip module, in addition to being usable with any chip array including the interconnect substrate, is adapted to convert such chip array to a standard sixty-eight (68) pin format.

In addition to providing economies in the manufacturing/assembly process and thereby significantly reducing product cost, the configuration of the present chip module and assembly methodology preferably employed in relation thereto allows for the testing of the chip array prior to the mounting of the same within the package, and the testing of the combined chip array/package prior to the chip array being sealed within the package. As a result, in the present chip module, either the chip array or the package may usually be salvaged in the event of an unsuccessful result being obtained during the testing process. Moreover, the configuration of the chip array of the present chip module provides a high level of adaptability to new memory or logic devices, thus substantially eliminating its susceptibility to rapid obsolescence. The completed chip module formed in accordance with the present invention also satisfies the most stringent military standards. These, and other advantages attributable to the present invention, will be described in more detail below.

BRIEF SUMMARY OF THE INVENTION

In accordance with the present invention, there is provided a chip module which includes a universal package for accommodating any one of uniquely configured chip arrays (e.g., memory or logic arrays). In the preferred embodiment, the chip array, which is a sub-assembly of the chip module, comprises an interconnect substrate having opposed, generally planar surfaces and including a first interconnect pad array disposed on at least one of the surfaces thereof. The interconnect substrate preferably has a generally square configuration defining four peripheral edge segments, with the first interconnect pad array extending along one of the peripheral edge segments. The first interconnect pad array itself preferably comprises first and second sets of conductive interconnect pads which are disposed on respective ones of the opposed surfaces of the interconnect substrate and extend along a common peripheral edge segment thereof. The conductive interconnect pads of the first and second sets are arranged in identical patterns such that the conductive interconnect pads of the first set are aligned with respective ones of the conductive interconnect pads of the second set. Additionally, a plurality of vias are preferably extended through the interconnect substrate between respective pairs of the conductive interconnect pads of the first and second sets thus establishing electrical contact or communication between the pads of each pair.

In addition to the interconnect substrate, the chip array of the present chip module comprises at least one integrated circuit chip which is attached to the interconnect substrate and electrically connected to the first interconnect pad array. In the present chip module, the integrated circuit chip is preferably incorporated into a packaged chip having a plurality of chip leads protruding therefrom. The chip leads are electrically connected to respective ones of a plurality of conductive lead pads which are disposed on at least one of the opposed surfaces of the interconnect substrate and are electrically connected to the first interconnect pad array. It is contemplated that the interconnect substrate of the chip array may include a plurality of conductive lead pads disposed on respective ones of the opposed surfaces thereof, with the chip leads of at least two packaged chips being electrically connected to the conductive lead pads on respective ones of the opposed surfaces of the interconnect substrate. As indicated above, the chip array may comprise a memory array or a logic array, with each of the packaged chips preferably being a memory or logic device selected from the group consisting of a TSOP I package, a TSOP II package, a QFP package, and a CSP package or the like.

Though the interconnect substrate of the chip array of the present chip module may be of a rigid construction, the same is preferably flexible and formed to have a thickness not exceeding about 0.015 inches. Importantly, this minimal thickness of the interconnect substrate, which results in its flexibility, provides the assembled chip array with a thin profile as well. The interconnect substrate is preferably fabricated from a polyamide, though alternative materials possessing similar characteristics may also be employed in relation thereto. Additionally, the interconnect substrate is preferably formed to include a pair of registry notches disposed within respective ones of the peripheral edge segments thereof which extend in generally perpendicular relation to the peripheral edge segment along which the first and second sets of conductive interconnect pads of the first interconnect pad array are extended.

In addition to the chip array, the chip module of the present invention comprises a package including a generally square main body and a lid attachable to the main body. The main body itself defines a cavity sized and configured to receive the chip array, and has a generally planar interconnect shelf which extends within the cavity and includes a second interconnect pad array disposed thereon. The second interconnect pad array comprises a third set of conductive interconnect pads which are arranged upon the shelf in a pattern identical to those of the first and second sets of conductive interconnect pads of the first interconnect pad array of the chip array. In the preferred chip module, a total of seventy-one (71) conductive interconnect pads are included in each of the first, second and third sets thereof. The main body of the package also includes a plurality of package leads which protrude therefrom and are electrically connected to the second interconnect pad array. More particularly, the main body preferably includes sixty-eight (68) package leads which extend about the periphery thereof. The package (i.e., the main body and lid) is preferably fabricated from co-fired alumina, though alternative materials possessing similar characteristics may also be employed in relation thereto.

In the present chip module, the chip array is insertable into the cavity of the main body such that the first and second interconnect pad arrays are in aligned contact with each other. Subsequent to the insertion of the chip array into the cavity and the electrical connection of the first and second interconnect pad arrays to each other in a prescribed manner, the attachment of the lid to the main body encloses and seals the chip array within the package. In the present chip module, the main body of the package is preferably formed to include an opposed pair of tabs which are insertable into respective ones of the registry notches of the interconnect substrate when the chip array is inserted into the cavity. Advantageously, the receipt of the tabs into the notches facilitates a proper registry between the first and second interconnect pad arrays.

Further in accordance with the present invention, there is provided a method of assembling a chip module. The preferred method comprises the initial step of assembling a chip array of the chip module. Such assembly is accomplished by attaching at least one integrated circuit chip, and more particularly at least two packaged chips, to respective ones of the opposed surfaces of the interconnect substrate such that the packaged chips are electrically connected to the first interconnect pad array of the interconnect substrate. Thereafter, the assembled chip array is inspected and tested.

Subsequent to being tested, the completed chip array is mounted to a package of the chip module. More particularly, the chip array is inserted into the cavity of the main body of the package such that the first interconnect pad array is in aligned contact with the second interconnect pad array provided on the interconnect shelf extending within the cavity of the main body. The first and second interconnect pad arrays are preferably attached to each other via soldering. In addition to the first and second interconnect pad arrays being soldered to each other, the interconnect substrate of the chip array may optionally be bonded to the main body of the package. After the chip array has been properly mounted to the main body of the package, the assembled chip array and main body are inspected and tested. Such inspection includes screening the assembly for proper burn-in, centrifuge, solderablility, etc.

Upon the completion of its testing, the assembled chip array and main body are preferably vacuum baked to remove moisture from the chip array (i.e., the interconnect substrate and packaged chips). Thereafter, the lid of the package is attached to the main body to enclose and seal the chip array within the package. The attachment of the lid to the main body may be accomplished through the use of a low temperature lid seal or through the use of a low temperature welding process which creates a seam seal between the lid and the main body. Thereafter, the chip module is tested for fine and gross leaks of the enclosed cavity of the package, with the completed chip module then being given a final test.

BRIEF DESCRIPTION OF THE DRAWINGS

These, as well as other features of the present invention, will become more apparent upon reference to the drawings wherein:

FIG. 5 is a top plan view of the interconnect substrate of the chip array of the present chip module;

FIG. 6 is a bottom plan view of the interconnect substrate shown in FIG. 5;

DETAILED DESCRIPTION OF THE INVENTION

Figure 1:
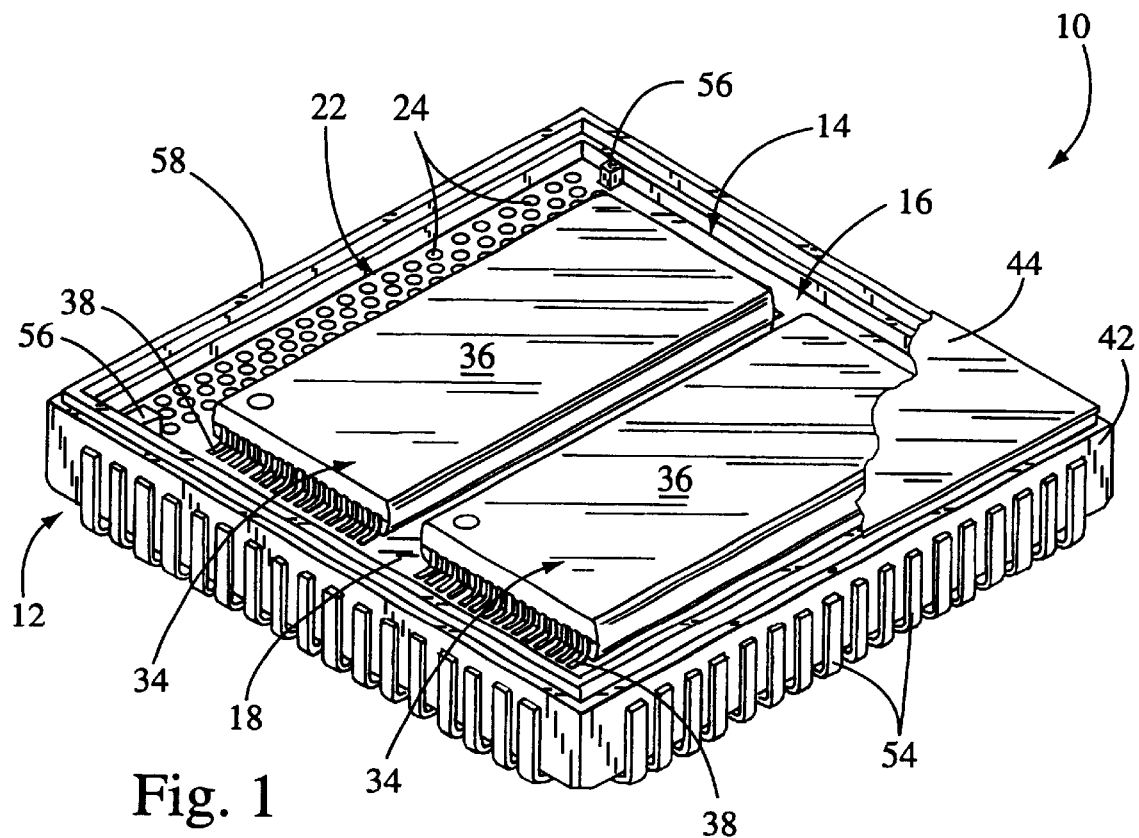
FIG. 1 is a top perspective view of a chip module constructed in accordance with the present invention with the lid of the package thereof being partially depicted.
Figure 2:
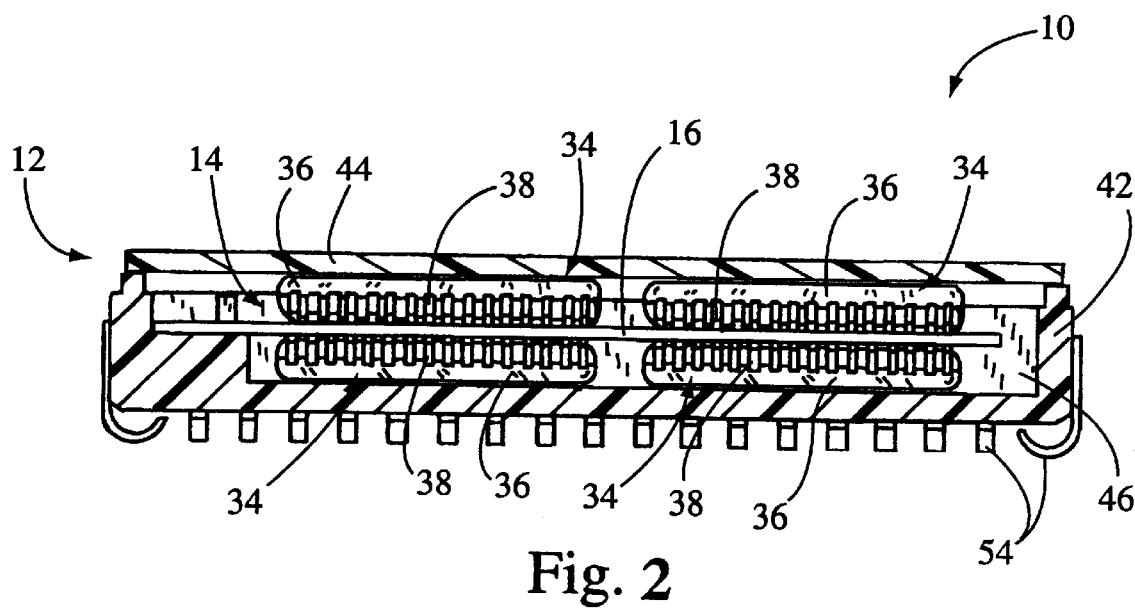
FIG. 2 is a cross-sectional view of the present chip module.

Referring now to the drawings wherein the showings are for purposes of illustrating a preferred embodiment of the present invention only, and not for purposes of limiting the same, FIG. 1 perspectively illustrates a chip module 10 constructed in accordance with the present invention. As will be described in more detail below, the chip module 10 includes a universal package 12 for accommodating a selectively configurable chip array 14 (e.g., a memory array or logic array). Referring now to FIGS. 1, 2 and 5–8B, the chip array 14, which is a sub-assembly of the chip module 10, comprises an interconnect substrate 16 having opposed, generally planar surfaces, and in particular a top surface 18 and a bottom surface 20. In the preferred embodiment, the interconnect substrate 16 has a generally square configuration defining four peripheral edge segments. Disposed upon the top and bottom surfaces 18, 20 is a first interconnect pad array 22 of the interconnect substrate 16 which extends along one of the peripheral edge segments defined thereby. The first interconnect pad array 22 is used to facilitate the surface mounting of the chip array 14 to the package 12 in a manner which will be described in more detail below.

As best seen in FIGS. 5, 6, 7A and 7B, the first interconnect pad array 22 itself preferably comprises a first set of conductive interconnect pads 24 which are disposed on the top surface 18, and a second set of conductive interconnect pads 26 which are disposed on the bottom surface 20. As indicated above, the conductive interconnect pads 24, 26 of the first and second sets, which collectively define the first interconnect pad array 22, extend along a common peripheral edge segment of the interconnect substrate 16. The conductive interconnect pads 24, 26 of the first and second sets are preferably though not necessarily arranged in identical patterns on the top and bottom surfaces 18, 20, respectively, such that the conductive interconnect pads 24 of the first set are aligned with respective ones of the conductive interconnect pads 26 of the second set. Additionally, a plurality of vias 28 are preferably extended through the interconnect substrate 16 between respective pairs of the conductive interconnect pads 24, 26 of the first and second sets for purposes of establishing electrical contact or communication between the pads 24, 26 of each pair. In the chip array 14, the first and second sets of conductive interconnect pads 24, 26 and associated vias 28 are formed through the use of conventional methodologies and are preferably fabricated from either gold or tin/lead. In this respect, the conductive interconnect pads 24, 26 are formed as conventional surface mount pads, with the vias 28 being conventionally formed as plated through-holes.

In addition to the first set of conductive interconnect pads 24 of the first interconnect pad array 22, disposed on the top surface 18 of the interconnect substrate 16 is a first set of conductive lead pads 30. Similarly, disposed on the bottom surface 20 of the interconnect substrate 16 is a second set of conductive lead pads 32. In the chip array 14, the interconnect substrate 16 is formed such that the conductive lead pads 30, 32 of the first and second sets are electrically connected to the first interconnect pad array 22. In this respect, though not shown, those of ordinary skill in the art will recognize that the conductive lead pads 30, 32 of the first and second sets and conductive interconnect pads 24, 26 of the first interconnect pad array 22 are electrically interconnected by conventional traces which form a printed circuit upon the interconnect substrate 16.

In addition to the interconnect substrate 16, the chip array 14 of the chip module 10 comprises a plurality of packaged chips 34, each of which comprises a body 36 having a plurality of chip pins or leads 38 protruding from respective ones of the opposed lateral edges thereof. As indicated above, the chip array 14 may comprise a memory array or a logic array, with each of the packaged chips 34 therefore preferably being either a memory device or a logic device. Although by way of example and not limitation, the packaged chips 34 may comprise conventional chip packages, such as a TSOP I package, a TSOP II package, a QFP package, and/or a CSP package. However, other packaged chips are expressly contemplated herein. In the chip array 14, the chip leads 38 of two packaged chips 34 are electrically connected to respective ones of the conductive lead pads 30 of the first set disposed upon the top surface 18, with the chip leads 38 of two packaged chips 34 being electrically connected to respective ones of the conductive lead pads 32 of the second set disposed upon the bottom surface 20.

The attachment of the chip leads 38 of the packaged chips 34 to the conductive lead pads 30, 32 of the first and second sets is preferably accomplished via soldering in accordance with conventional methodologies. As such, the chip array 14 includes a total of four packaged chips 34. However, those of ordinary skill in the art will recognize that the chip array 14 may be provided with fewer or greater than four packaged chips 34, and that the conductive lead pads 30, 32 may be provided on only the top surface 18 or the bottom surface 20 of the interconnect substrate 16. Additionally, it is contemplated that one or more non-packaged integrated circuit chips may be attached to the interconnect substrate 16 and electrically connected to the first interconnect pad array 22 as an alternative to the integrated circuit chip being incorporated into a packaged chip 34. Like the conductive interconnect pads 22, 24 of the first and second sets, the conductive lead pads 30, 32 of the first and second sets are preferably fabricated from either gold or tin/lead.

Though the interconnect substrate 16 of the chip array 14 may be of a rigid construction, the same is preferably flexible and formed to have a thickness not exceeding about 0.015 inches. As indicated above, this minimal thickness of the interconnect substrate 16, which results in its flexibility, provides the assembled chip array 14 with a thin profile. The interconnect substrate 16 is preferably fabricated from a polyamide, though alternative materials possessing similar characteristics may also be employed in relation thereto. Additionally, as best seen in FIGS. 5 and 6, the interconnect substrate 16 is preferably formed to include a pair of notches 40 disposed within respective ones of the peripheral edge segments thereof which extend in generally perpendicular relation to the peripheral edge segment along which the first and second sets of conductive interconnect pads 24, 26 of the first interconnect pad array 22 are extended. The use of the notches 40 will be described in more detail below.

Referring now to FIGS. 1–4, the package 12 of the chip module 10 comprises a generally square main body 42 and a lid 44 which is attachable to the main body 42 in a manner which will also be described in more detail below. The main body 42 itself defines a cavity 46 which is sized and configured to receive the chip array 14. Extending within and along one side of the cavity 46 is a generally planar interconnect shelf 48 which includes a second interconnect pad array 50 disposed thereon. The second interconnect pad array 50 comprises a third set of conductive interconnect pads 52 which are arranged upon the interconnect shelf 48 in a pattern identical to those of the first and second sets of conductive interconnect pads 24, 26 of the chip array 14. In the chip module 10, a total of seventy-one conductive interconnect pads 24, 26, 52 are included in each of the first, second and third sets thereof. Like the conductive interconnect pads 24, 26 of the first and second sets, the conductive interconnect pads 52 of the third set are also preferably fabricated from either gold or tin/lead.

Figure 3:
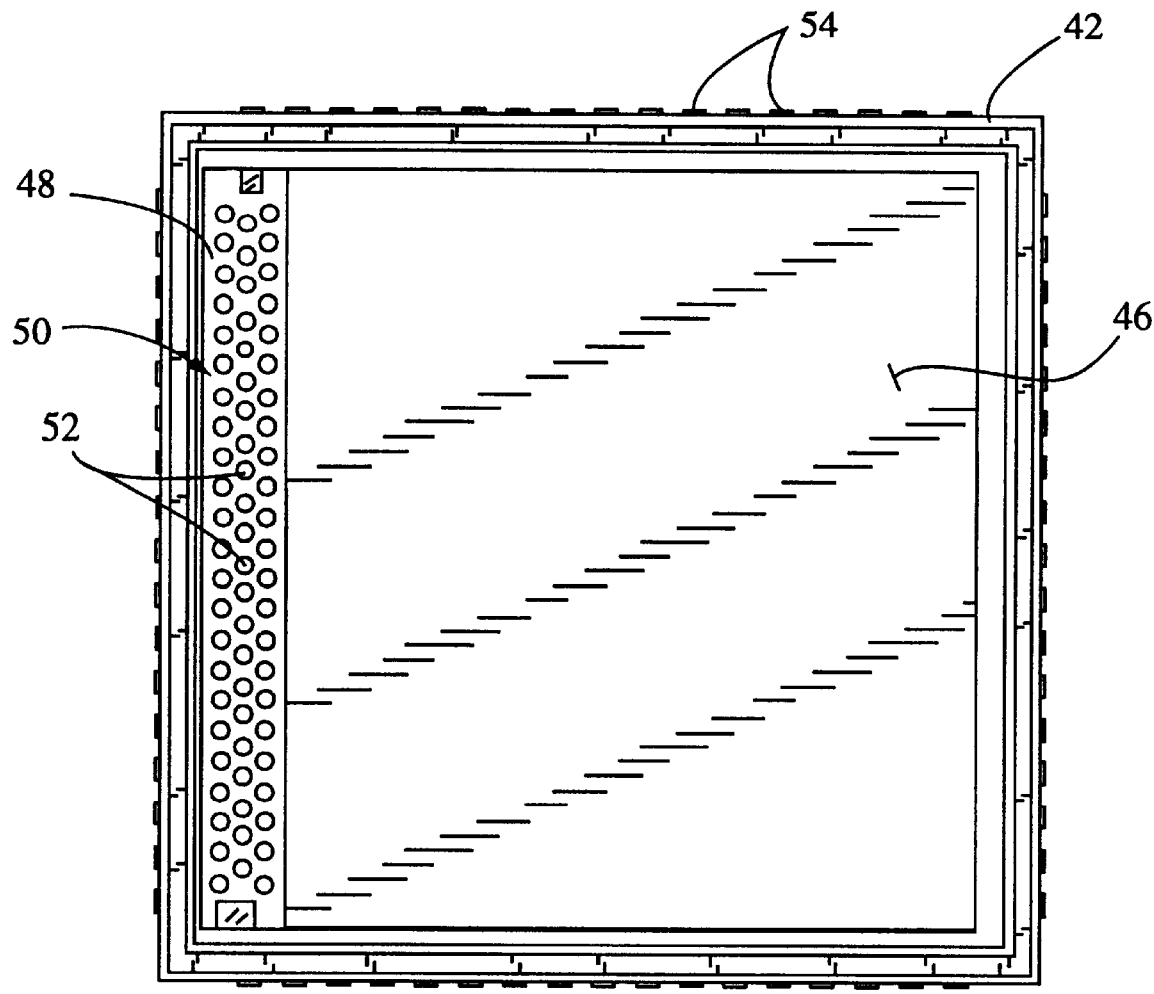
FIG. 3 is a top view of the main body of the package of the present chip module.
Figure 4:
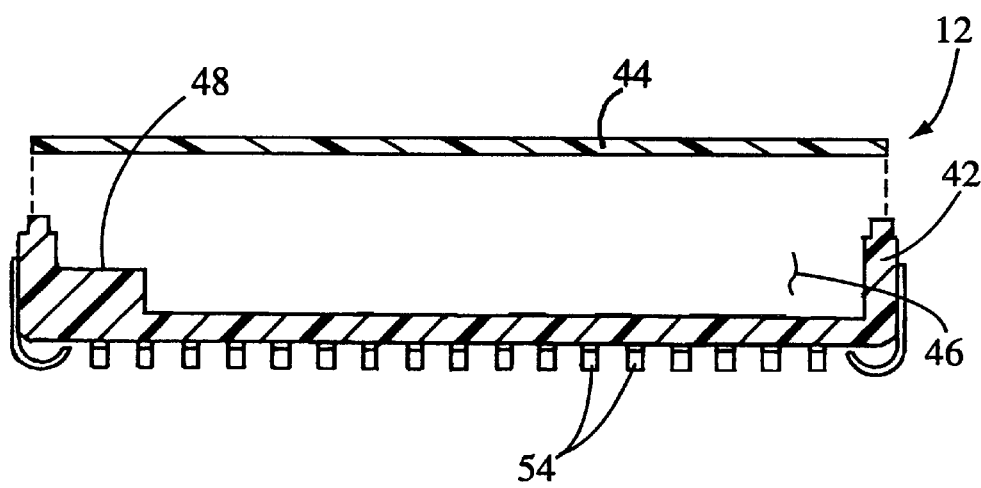
FIG. 4 is a cross-sectional view of the package of the present chip module, illustrating the lid of the package as being separated from the main body thereof.
Figure 7A:
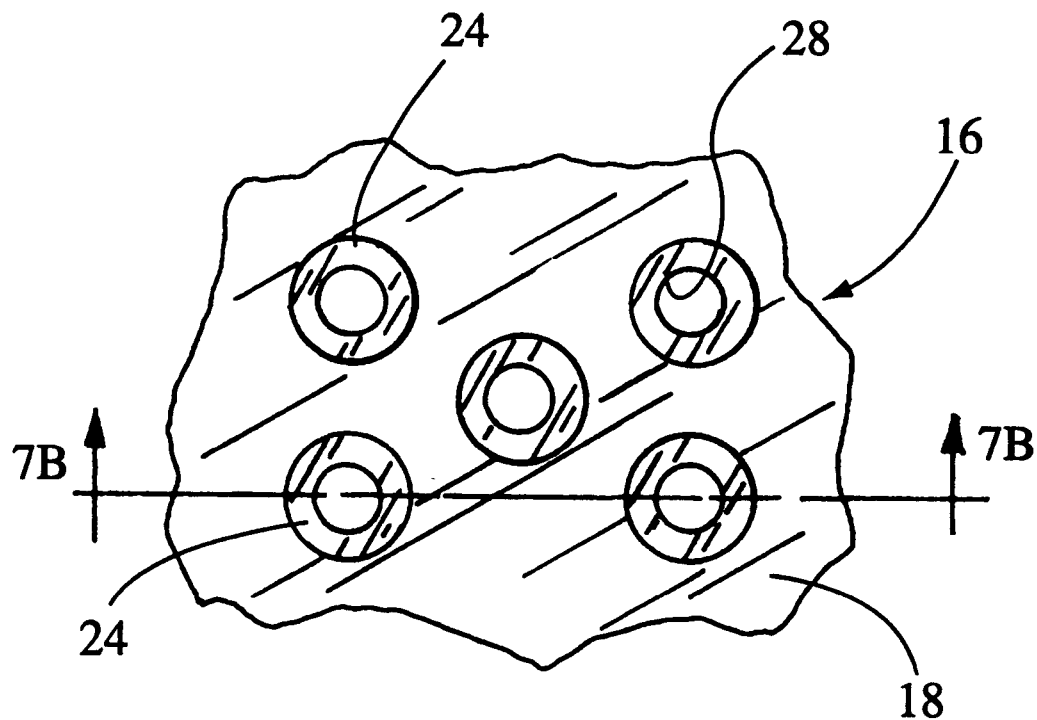
FIG. 7A is a partial top plan view of the first interconnect pad array of the interconnect substrate shown in FIGS. 5 and 6.
Figure 7B:
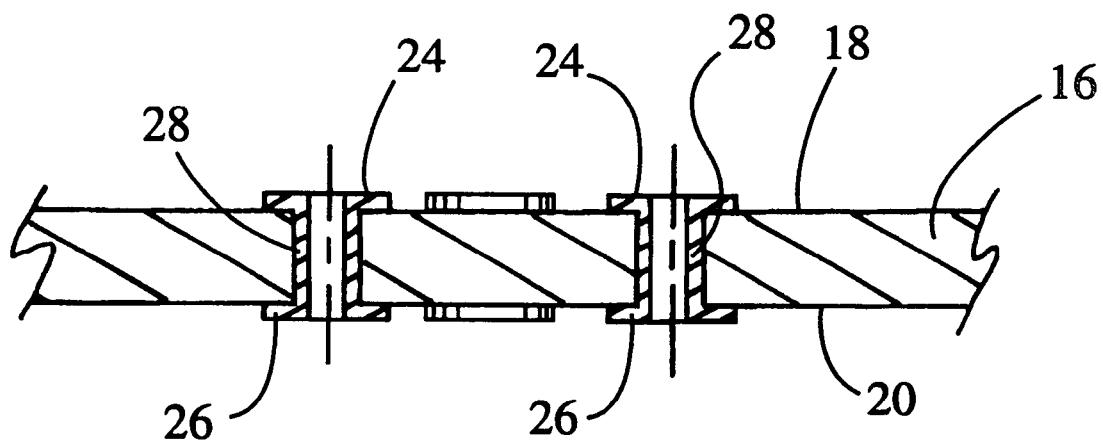
FIG. 7B is a partial cross-sectional view of the interconnect substrate shown in FIGS. 5 and 6, illustrating the manner in which vias extend between respective pairs of first and second sets of conductive interconnect pads of the first interconnect pad array.
Figure 8A:
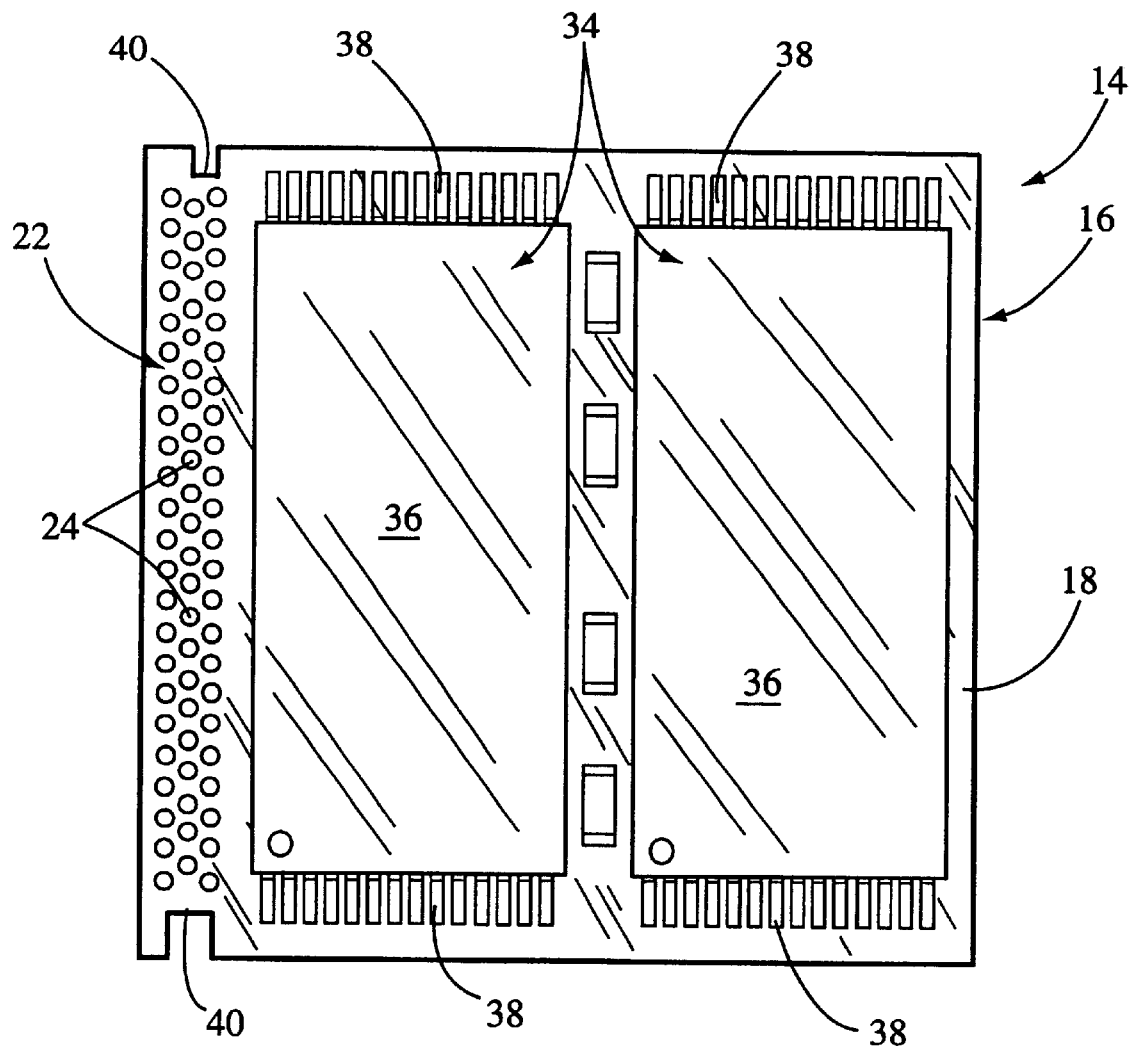
FIG. 8A is a top plan view of the assembled chip array of the present chip module.
Figure 8B:
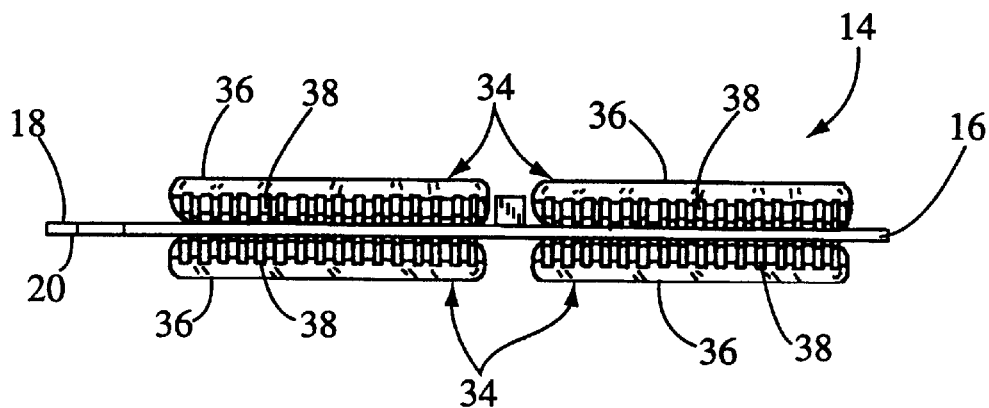
FIG. 8B is a side-elevational view of the chip array shown in FIG. 8A.

As best seen in FIGS. 1, 3 and 4, the main body 42 of the package 12 includes a plurality of package leads 54 which protrude therefrom and have inwardly turned or curved distal ends. In the chip module 10, the main body 42 of the package 12 is formed such that the package leads 54 are electrically connected to the second interconnect pad array 50. The main body 42 preferably includes sixty-eight package leads 54 which extend about the periphery thereof. More particularly, the package leads 54 collectively define JEDEC sixty-eight pin JLCC mechanical and industry standard pinouts. However, those of ordinary skill in the art will further recognize that the main body 42 may be provided with differing numbers of package leads 54 extending therefrom to define other standard pin configurations depending on the desired use of the chip module 10. The package 12 (i.e., the main body 42 and lid 44) is preferably fabricated from co-fired alumina, though alternative materials possessing similar characteristics may also be employed in relation thereto.

In the chip module 10 of the present invention, the chip array 14 is insertable into the cavity 46 of the main body 42 such that the first and second interconnect pad arrays 22, 50 are in aligned contact with each other. Due to the conductive interconnect pads 24, 26, 52 of the first, second and third sets being provided in identical patterns, the proper insertion of the chip array 14 into the cavity 46 of the main body 42 will result in the conductive interconnect pads 24, 26 of either the first or second sets being in aligned (i.e., registered) contact with respective ones of the conductive interconnect pads 52 of the third set. It is contemplated that the chip array 14 may be inserted into the cavity 46 such that either the conductive interconnect pads 24 of the first set or the conductive interconnect pads 26 of the second set are in aligned contact with the conductive interconnect pads 52 of the third set. Subsequent to the insertion of the chip array 14 into the cavity 46 and the electrical connection of the first and second interconnect pad arrays 22, 50 to each other in a prescribed manner, the attachment of the lid 44 to the main body 42 encloses and seals the chip array 14 within the package 12.

As best seen in FIG. 3, the main body 42 of the package 12 is preferably formed to include an opposed pair of tabs 56 which extend along opposed end portions of the interconnect shelf 48 and are insertable into respective ones of the notches 40 of the interconnect substrate 16 when the chip array 14 is inserted into the cavity 46. Advantageously, the receipt of the tabs 56 into the registry notches 40 facilitates a proper registry between the first and second interconnect pad arrays 22, 50. As seen in FIGS. 3, 5, 6 and 8A, the notches 40 are preferably formed to be of differing sizes, with the tabs 56 also being of differing sizes which are receivable into respective ones of the notches 40. This sizing difference allows the chip array 14 to be inserted into the cavity 46 in only one prescribed orientation. As such, though the conductive interconnect pads 22, 24 of either the first or second sets may be placed into direct contact with the conductive interconnect pads 52 of the third set, the chip array 14 must be appropriately configured such that the desired electrical connections are achieved when the tabs 56 are inserted into the notches 40.

Figure 9:
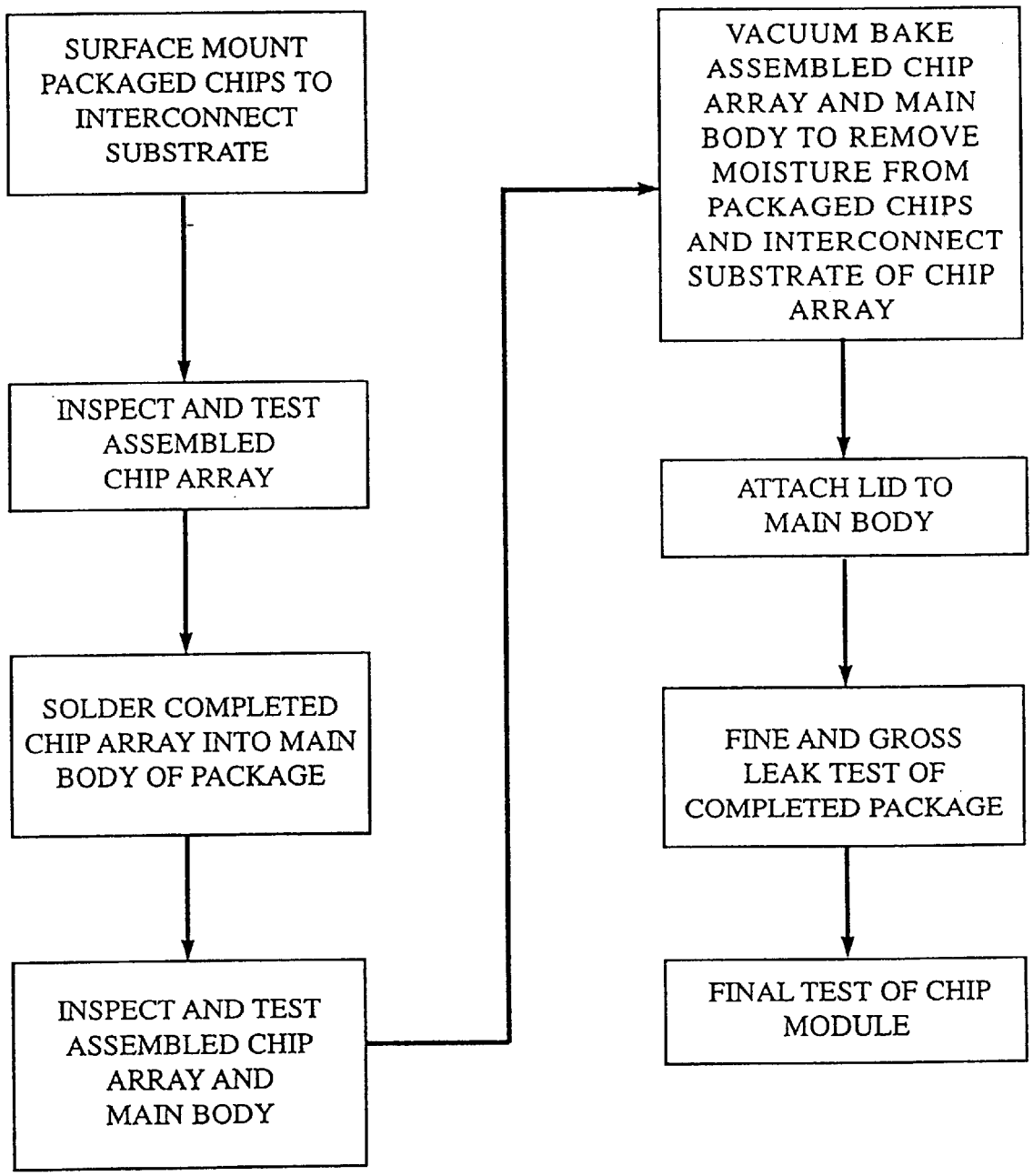
FIG. 9 is a flow chart which describes the preferred sequence of steps used for assembling the present chip module.

Having thus described the structural attributes of the chip module 10, the preferred method of assembling the same will now be described with particular reference to FIG. 9. The preferred method comprises the initial step of assembly the chip array 14 of the chip module 10 in the previously described manner. As indicated above, such assembly is preferably accomplished by attaching one or more packaged chips 34 to one or both of the top and bottom surfaces 18, 20 of the interconnect substrate 16 through the use of conventional surface mount assembly techniques such that the packaged chip(s) 34 are mounted and electrically connected to respective ones of either the first and/or second sets of conductive lead pads 30, 32, and hence the first interconnect pad array 22 of the interconnect substrate 16. Thereafter, the assembled chip array 14 may be inspected and tested to ensure proper function and electrical contact between the packaged chip(s) 34 and the interconnect substrate 16.

Subsequent to being tested, the assembled chip array 14 is mounted to the main body 42 of the package 12. More particularly, the chip array 14 is inserted into the cavity 46 of the main body 42 such that the tabs 56 are received into respective ones of the notches 40, thus facilitating the proper registry and aligned contact between the first and second interconnect pad arrays 22, 50. The first and second interconnect pad arrays 22, 50 are preferably electrically connected to each other via conventional soldering techniques. In addition to the first and second interconnect pad arrays 22, 50 being soldered to each other, the interconnect substrate 16 of the chip array 14 may optionally be bonded to the main body 42 of the package 12. After the chip array 14 has been properly mounted to the main body 42, the assembled chip array 14 and main body 42 may be inspected and tested. Such inspection includes screening the assembly for proper burn-in, centrifuge, solderability, etc.

Upon the completion of its testing, the assembled chip array 14 and main body 42 are preferably vacuum baked to remove moisture from the chip array 14 (i.e., the interconnect substrate 16 and packaged chip(s) 34). Thereafter, the lid 44 of the package 12 is attached to the main body 42 to enclose and seal the chip array 14 within the package 12. The attachment of the lid 44 to the main body 42 may be accomplished through the use of a low temperature lid seal or seal ring 58 which is preferably fabricated from covar. Alternatively, the attachment of the lid 44 to the main body 42 may be accomplished through the use of a low temperature welding process which creates a seam seal between the lid 44 and main body 42. Subsequent to the attachment of the lid 44 to the main body 42, the chip module 10 is tested for fine and gross leaks of the enclosed cavity 46 of the package 12, with the completed chip module 10 then being given a final test.

As indicated above, the package 12 of the present chip module 10 is universal in that the same is capable of accommodating any one of differently configured chip arrays 14 which include the interconnect substrate 16. As such, a modification to the functional attributes of the chip module 10 requires only a change in the printed circuit on the interconnect substrate 16 to accommodate differing memory and/or logic devices, with no change being required for the package 12. The relative ease and low cost of making changes to the printed circuit on the interconnect substrate 16, coupled with the lack of a need for changes in the tooling used to fabricate the package 12, permits rapid upgrades or changes in the chip module 10 to avoid obsolescence.

Additional modifications and improvements of the present invention may also be apparent to those of ordinary skill in the art. For example, the chip array 14 of the chip module 10 may comprise a chip stack mounted to the interconnect substrate 16, with the cavity 46 of the main body 42 and lid 44 being configured to accommodate such chip array 14. Thus, the particular combination of parts and steps described and illustrated herein is intended to represent only one embodiment of the present invention, and is not intended to serve as limitations of alternative devices within the spirit and scope of the invention.

What is claimed is:

1. A method of assembling a chip module, comprising the steps of:
   (a) assembling a chip array of the chip module by attaching at least two packaged chips to respective ones of opposed, generally planar surfaces of an interconnect substrate such that the packaged chips are electrically connected to a first interconnect pad array of the interconnect substrate;
   (b) testing the chip array;
   (c) mounting the chip array to a package of the chip module;
   (d) testing the assembled chip array and package;
   (e) enclosing and sealing the chip array within the package; and
   (f) testing the completed chip module.

2. The method of claim 1 wherein step (b) comprises inspecting the assembled chip array prior to the testing thereof.

3. The method of claim 1 wherein step (c) comprises the steps of:
   (1) providing a main body defining a cavity sized and configured to receive the chip array and having a generally planar interconnect shelf which extends within the cavity includes a second interconnect pad array disposed thereon;
   (2) inserting the chip array into the cavity such that the first interconnect pad array is in aligned contact with the second interconnect pad array; and
   (3) soldering the first and second interconnect pad arrays to each other.

4. The method of claim 3 wherein step (3) further comprises bonding the interconnect substrate of the chip array to the main body of the package.

5. The method of claim 3 wherein step (d) comprises inspecting the assembled chip array and main body prior to the testing thereof.

6. The method of claim 3 wherein step (e) comprises attaching a lid of the package to the main body to enclose and seal the chip array within the package.

7. The method of claim 6 wherein step (e) comprises vacuum baking the assembled chip array and main body to remove moisture from the chip array prior to attaching the lid to the main body.

8. The method of claim 6 wherein step (e) comprises attaching the lid to the main body through the use of a low temperature lid seal.

9. The method of claim 6 wherein step (e) comprises attaching the lid to the main body through the use of a low temperature welding process.

10. The method of claim 6 wherein step (f) comprises testing for fine and gross leaks of the enclosed cavity of the package.

* * * * *